(12) United States Patent
Hashizume

(10) Patent No.: US 7,959,820 B2
(45) Date of Patent: Jun. 14, 2011

(54) SUBSTRATE PROCESSING METHOD AND SUBSTRATE PROCESSING APPARATUS

(75) Inventor: Akio Hashizume, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1241 days.

(21) Appl. No.: 11/548,855

(22) Filed: Oct. 12, 2006

(65) Prior Publication Data

US 2007/0087456 A1  Apr. 19, 2007

(30) Foreign Application Priority Data

Oct. 14, 2005 (JP) ................................. 2005-299865
Oct. 6, 2006 (JP) ................................. 2006-275098

(51) Int. Cl.
*C03C 15/00* (2006.01)
(52) U.S. Cl. .............. 216/88; 216/83; 216/103; 134/1.2
(58) Field of Classification Search ................. 216/103, 216/104, 83, 88, 91; 134/26, 30, 36, 1.1; 438/745
See application file for complete search history.

(56) References Cited

U.S. PATENT DOCUMENTS

| | | | |
|---|---|---|---|
| 5,866,307 A | 2/1999 | Kiba et al. | |
| 5,896,875 A | 4/1999 | Yoneda | |
| 6,217,657 B1 | 4/2001 | Kiba et al. | |
| 6,274,506 B1 | 8/2001 | Christenson et al. | |
| 6,615,854 B1 | 9/2003 | Hongo et al. | |
| 6,815,150 B2 | 11/2004 | Nakahara et al. | |
| 6,815,376 B2 | 11/2004 | Tsai | |
| 2002/0035762 A1 | 3/2002 | Okuda et al. | |
| 2002/0059947 A1 | 5/2002 | Sato et al. | |
| 2004/0007559 A1 | 1/2004 | Hongo et al. | |
| 2004/0074526 A1* | 4/2004 | Aoki et al. ........................ 134/36 |
| 2004/0089328 A1 | 5/2004 | Sato et al. | |
| 2004/0200513 A1 | 10/2004 | Okuda et al. | |
| 2004/0206378 A1 | 10/2004 | Okuda et al. | |
| 2004/0206379 A1 | 10/2004 | Okuda et al. | |
| 2004/0206452 A1 | 10/2004 | Okuda et al. | |
| 2004/0261817 A1 | 12/2004 | Araki et al. | |
| 2005/0085087 A1 | 4/2005 | Okigawa et al. | |
| 2005/0115671 A1 | 6/2005 | Araki | |
| 2005/0158671 A1* | 7/2005 | Shimizu et al. ................ 430/329 |

FOREIGN PATENT DOCUMENTS

| | | |
|---|---|---|
| CN | 1624871 | 6/2005 |
| JP | 2001-308070 | 11/2001 |
| JP | 2002-208579 | 7/2002 |
| JP | 2003-177556 | 6/2003 |
| JP | 2005-109167 | 4/2005 |
| KR | 10-0423771 | 4/1997 |
| KR | 2000-0077317 | 12/2000 |
| TW | 535216 | 6/2003 |
| TW | 200511431 | 3/2005 |

OTHER PUBLICATIONS

Office Action issued on Jan. 16, 2009 in connection with corresponding Chinese Patent Application No. 200610142366.8.
Office Action issued Mar. 25, 2008 in connection with the Korean Patent Application No. 10-2006-0098398.

(Continued)

*Primary Examiner* — Lan Vinh
(74) *Attorney, Agent, or Firm* — Ostrolenk Faber LLP

(57) ABSTRACT

According to the substrate processing method of the invention, a jet of droplets generated from a gas and a heated processing liquid is supplied to the surface of a substrate. A resist stripping liquid to strip off the resist from the surface of the substrate is then supplied to the surface of the substrate.

9 Claims, 6 Drawing Sheets

OTHER PUBLICATIONS

Taiwan Office Action issued May 18, 2010 in connection with corresponding Taiwanese Patent Application No. 095137709.

Office Action issued Apr. 7, 2011 in connection with corresponding Japanese Patent Application No. 2006-275098.

* cited by examiner

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus applied to remove a resist from the surface of a substrate. The substrate includes a semiconductor wafer, a glass substrate for a liquid crystal display, a glass substrate for a plasma display, a glass substrate for an FED (Field Emission Display), an optical disc substrate, a magnetic disc substrate, a magneto-optical disc substrate, a photomask substrate, and so forth.

2. Description of Related Art

The manufacturing process of a semiconductor device includes, for example, a step of locally implanting impurities (ions), such as phosphorous, arsenic, and boron, on the surface of a semiconductor wafer (hereinafter, referred to simply as the wafer). In this step, in order to prevent ions from being implanted in an undesired portion, a resist made of a photosensitive resin is formed in a pattern on the surface of the wafer, so that a portion where the ion implantation is not desired is masked by the resist. The resist formed in a pattern on the surface of the wafer is unnecessary after the ion implantation. Resist removing processing is therefore performed after the ion implantation to remove the unnecessary resist on the surface of the wafer by stripping.

In the resist removing processing, the resist on the surface of the wafer is removed, for example, by ashing in an ashing apparatus. The wafer is then carried into a cleaning apparatus to remove resist polymer remaining after the ashing from the surface of the wafer.

In the ashing device, for example, the inside of a processing chamber accommodating the wafer is brought into an oxygen gas atmosphere and a microwave is irradiated into the oxygen gas atmosphere. This gives rise to a plasma of the oxygen gas (oxygen plasma) within the processing chamber, and this oxygen plasma is irradiated on the surface of the wafer. The resist film on the surface of the wafer is consequently removed by decomposition.

In the cleaning apparatus, for example, a chemical, such as APM (Ammonia-hydrogen Peroxide Mixture), is supplied to the surface of the wafer to apply cleaning processing (resist polymer removing processing) using the chemical to the surface of the wafer. The resist polymer adhering onto the surface of the wafer is removed by this cleaning processing.

Ashing using a plasma, however, has a problem that the surface of the wafer is damaged in a portion uncovered with the resist film (for example, an exposed oxide film).

Such being the case, as an alternative to the ashing by a plasma and the cleaning processing using a chemical, such as APM, it is proposed to supply SPM (Sulfuric acid/hydrogen Peroxide Mixture), which is a mixed liquid of sulfuric acid and a hydrogen peroxide liquid, to the surface of the wafer, so that the resist formed on the surface of the wafer is removed by stripping with a strong oxidation force of peroxomonosuliric acid ($H_2SO_5$) contained in the SPM.

However, because the surface of the resist has been altered (hardened) in an ion-implanted wafer (in particular, in the case of a high-dose ion implantation), the resist cannot be removed in a satisfactory manner or it takes time to remove the resist.

SUMMARY OF THE INVENTION

An object of the invention is therefore to provide a substrate processing method and a substrate processing apparatus that enable to strip off (remove) the resist used as the mask during the ion implantation in a satisfactory manner without giving damage to the substrate.

A substrate processing method of the invention includes: a jet of droplets supplying step of supplying a jet of droplets generated from a gas and a heated processing liquid to a surface of a substrate, and a resist stripping liquid supplying step of supplying a resist stripping liquid to strip off a resist from the surface of the substrate to the surface of the substrate after the jet of droplets supplying step.

A jet of droplets generated by mixing a gas and a heated processing liquid has a large energy. Hence, even when a hardened layer is formed on the surface of the resist, by supplying a jet of droplets to the surface of the substrate, it is possible to break the hardened layer. By supplying the resist stripping liquid to the surface of the substrate after the hardened layer on the surface of the resist is broken, the resist stripping liquid can penetrate into the inside of the resist from broken portions of the hardened layer. It is thus possible to remove the resist having the hardened layer formed on the surface of the substrate in a satisfactory manner with the use of the resist stripping liquid even when the substrate to be processed has not undergone the ashing processing to remove the resist including the hardened layer by ashing. In addition, because the ashing is unnecessary, a problem of damages arising from the ashing can be avoided.

The substrate processing method can be implemented in a substrate processing apparatus including: a substrate holding mechanism that holds a substrate; a processing liquid heating mechanism that heats a processing liquid; a jet of droplets supplying mechanism that generates a jet of droplets from a gas and the processing liquid heated by the processing liquid heating mechanism and supplies the jet of droplets to a surface of the substrate held by the substrate holding mechanism; a resist stripping liquid supplying mechanism that supplies a resist stripping liquid to strip off a resist from the surface of the substrate to the surface of the substrate held by the substrate holding mechanism; and a control unit that controls the jet of droplets supplying mechanism and the resist stripping liquid supplying mechanism, so that the resist stripping liquid supplying mechanism supplies the resist stripping liquid after the jet of droplets is supplied by the jet of droplets supplying mechanism.

It is preferable that the substrate processing method further includes: a substrate rotating step of rotating the substrate and a liquid supplying step of supplying a liquid to the surface of the substrate in parallel with the substrate rotating step, and that the liquid supplying step is performed in parallel with the jet of droplets supplying step.

The substrate processing apparatus that implements the foregoing includes, in addition to the configuration described above, a substrate rotating mechanism that rotates the substrate held by the substrate holding mechanism, and a liquid supplying mechanism that supplies a liquid to the surface of the substrate held by the substrate holding mechanism. The control unit controls the jet of droplets supplying mechanism, the substrate rotating mechanism, and the liquid supplying mechanism, so that the liquid supplying mechanism supplies the liquid to the surface of the substrate while the substrate is rotated in parallel with a supply of the jet of droplets by the jet of droplets supplying mechanism.

A jet of droplets and a liquid are supplied to the surface of the substrate while the substrate is rotated. The liquid supplied to the surface of the substrate flows over the surface of the substrate toward the outer periphery of the substrate by a centrifugal force induced by the rotations of the substrate. Pieces of the hardened layer broken by a jet of droplets are thus removed from the surface of the substrate by being rinsed away with the liquid. It is thus possible to prevent the pieces of the broken hardened layer from adhering again onto the surface of the substrate.

It is preferable that the resist stripping liquid includes a mixed liquid of sulfuric acid and a hydrogen peroxide liquid.

By supplying a mixed liquid of sulfuric acid and a hydrogen peroxide liquid, that is, SPM, to the surface of the substrate, it is possible to strip off the resist formed on the surface of the substrate in a satisfactory manner with a strong oxidation force of peroxomonosulfuric acid contained in the SPM.

It is preferable that the jet of droplets supplying step is a step of supplying a jet of droplets generated from a heated gas and a heated processing liquid.

Energy of a jet of droplets can be increased further by heating a gas used to generate a jet of droplets. As a result, the hardened layer on the surface of the resist can be broken in a more satisfactory manner.

The above and other objects, features, and advantages of the invention will become more apparent from the following description of embodiments with reference to the accompanying drawings.

DETAILED DESCRIPTION OF THE PREFERRED EMBODIMENTS

Figure 1:
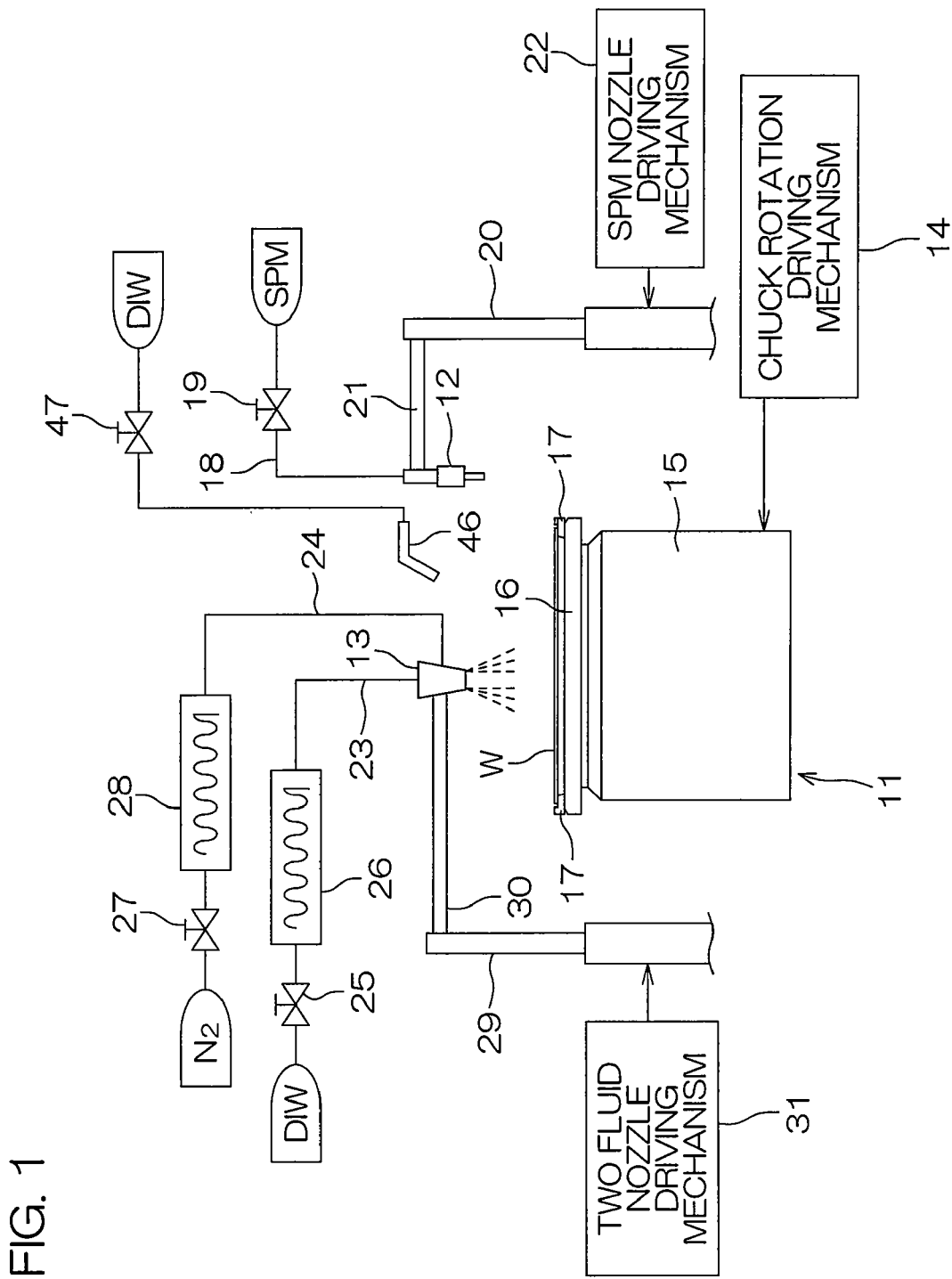
FIG. 1 is a view schematically showing a configuration of a substrate processing apparatus according to one embodiment of the invention.

FIG. 1 is a view schematically showing a configuration of a substrate processing apparatus according to one embodiment of the invention.

This substrate processing apparatus is, for example, an apparatus of a single substrate processing type that performs processing to remove unnecessary resist from the surface of a semiconductor wafer W (hereinafter, referred to simply as the wafer W) as an example of substrates by stripping after the ion implantation processing to implant impurities on the surface of the wafer W. The substrate processing apparatus includes a spin chuck 11 that rotates while holding the wafer W in almost a horizontal posture, an SPM nozzle 12 to supply SPM as a resist stripping liquid to the surface (top surface) of the wafer W held by the spin chuck 11, a two fluid nozzle 13 to supply a jet of droplets of heated DIW (deionized water) to the surface of the wafer W held by the spin chuck 11, and a DIW nozzle 46 to supply a continuous flow of DIW to the surface of the wafer W held by the spin chuck 11.

The spin chuck 11 includes an almost disc-shaped spin base 16 and a plurality of holder members 17 to hold the wafer W almost in a horizontal posture. The spin base 16 is fixed to the top end of a rotating shaft 15 rotated by a chuck rotation driving mechanism 14. The holder members 17 are provided to plural points on the rim portion of the spin base 16 at nearly equiangular intervals. By rotation of the rotating shaft 15 by the chuck rotation driving mechanism 14 while the waver W is held by the holder members 17, it is possible to rotate the wafer W together with the spin base 16 about the central axis line of the rotating shaft 15 while being kept almost in a horizontal posture.

The spin chuck 11 is not limited to the one configured as above, and for example, a vacuum chuck of a vacuum suction type may be adopted. The vacuum chuck holds the wafer W in a horizontal posture by vacuum-sucking the back surface (non-device surface) of the wafer W, and is further able to rotate the wafer W being held by rotating about the vertical axis line while keeping this holding state.

The SPM nozzle 12 is, for example, a straight nozzle that discharges SPM in the state of a continuous flow. An SPM supply pipe 18 is connected to the SPM nozzle 12. Hot SPM at about 80° C. or higher capable of stripping off the resist on the surface of the wafer W in a satisfactory manner is supplied to the SPM nozzle 12 through the SPM supply pipe 18. An SPM valve 19 to control a supply of the SPM to the SPM nozzle 12 is interposed in the SPM supply pipe 18.

The SPM nozzle 12 is also a scan nozzle capable of changing the supply position of the SPM on the surface of the wafer W. A first rotating shaft 20 is disposed on a side of the spin chuck 11 almost along the vertical direction. The SPM nozzle 12 is attached to the distal end portion of a first arm 21 extending almost horizontally from the top end portion of the first rotating shaft 20. An SPM nozzle driving mechanism 22 is coupled to the first rotating shaft 20. By inputting a driving force into the first rotating shaft 20 from the SPM nozzle driving mechanism 22 to rotate the first rotating shaft 20 about the central axis line within a predetermined angular range, it is possible to oscillate the first arm 21 above the wafer W held by the spin chuck 11. By oscillating the first arm 21, it is possible to scan (move) the supply position of the SPM from the SPM nozzle 12 on the surface of the wafer W held by the spin chuck 11.

A DIW supply pipe 23 through which DIW from a DIW supply source is supplied and a nitrogen gas supply pipe 24 through which a high-pressure nitrogen gas is supplied from a nitrogen gas supply source are connected to the two fluid nozzle 13. In the DIW supply pipe 23, a DIW valve 25 and a DIW heater 26 to heat DIW flowing through the DIW supply pipe 23 are interposed sequentially from the DIW supply source side. Also, in the nitrogen gas supply pipe 24, a nitrogen gas valve 27 and a nitrogen gas heater 28 to heat a nitrogen gas flowing through the nitrogen gas supply pipe 24 are interposed sequentially from the nitrogen gas supply source side. When the DIW valve 25 and the nitrogen gas valve 27 are opened, the DIW and the nitrogen gas start to flow through the DIW supply pipe 23 and the nitrogen gas supply pipe 24, respectively. The DIW and the nitrogen gas are heated while they are flowing by the DIW heater 26 and the nitrogen gas heater 28, respectively. Since the DIW and the nitrogen gas heated at about 50° C. or higher are mixed at the two fluid nozzle 13, fine droplets of DIW are formed. A jet of these DIW droplets is thus supplied to the surface of the wafer W held by the spin chuck 11 from the two fluid nozzle 13.

In addition, a second rotating shaft 29 is disposed on a side of the spin chuck 11 almost along the vertical direction. The two fluid nozzle 13 is attached to the distal end portion of a second arm 30 extending almost horizontally from the top end portion of the second rotating shaft 29. A two fluid nozzle driving mechanism 31 is coupled to the second rotating shaft 29. By inputting a driving force to the second rotating shaft 29 from the two fluid nozzle driving mechanism 31 to rotate the second rotating shaft 29 about the central axis line within a predetermined angular range, it is possible to oscillate the second arm 30 above the wafer W held by the spin chuck 11. By oscillating the second arm 30, it is possible to scan (move) the supply position of a jet of DIW droplets from the two fluid nozzle 13 on the surface of the wafer W held by the spin chuck 11.

DIW is supplied to the DIW nozzle 46 via a DIW valve 47.

Figure 2:
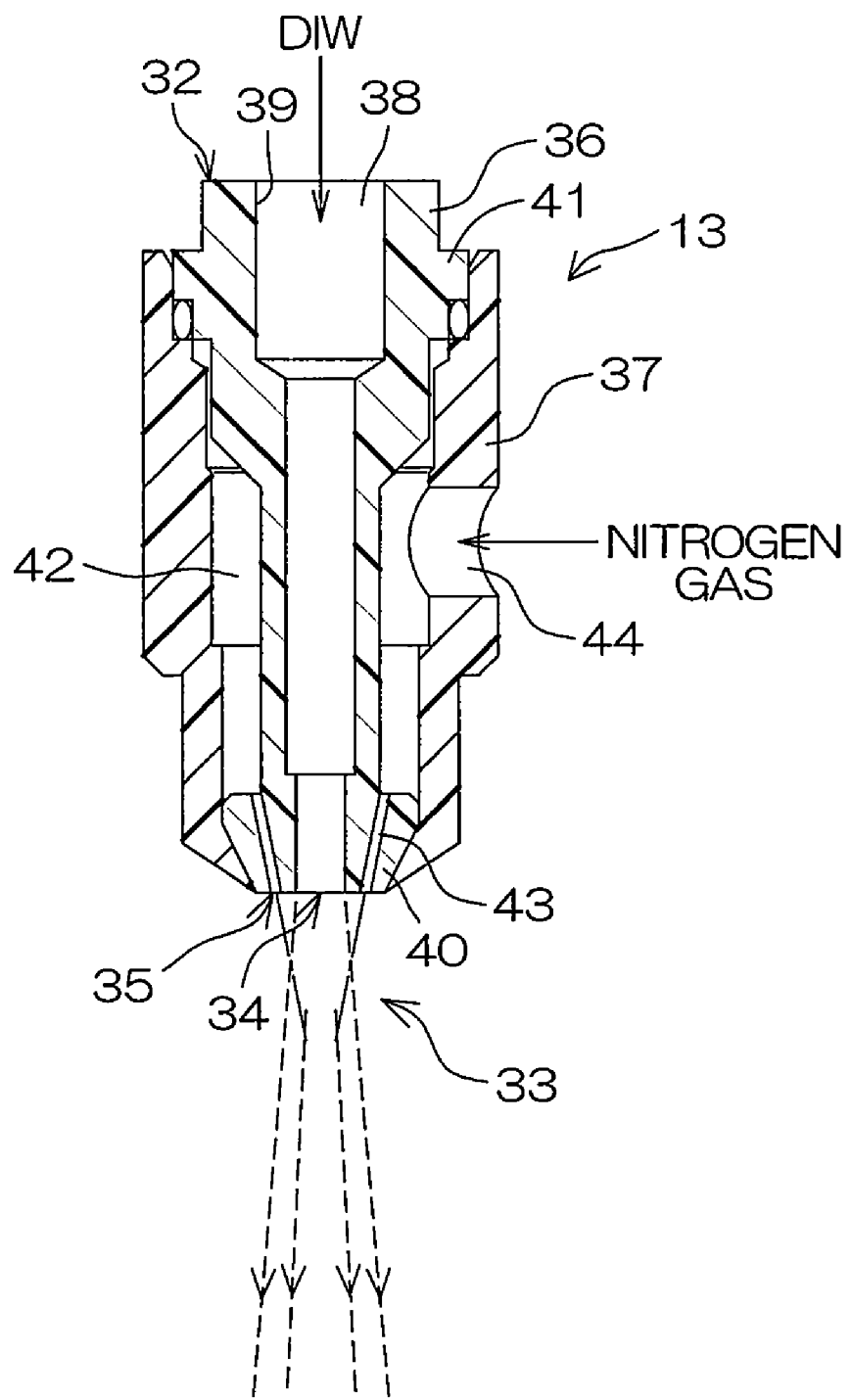
FIG. 2 is a schematic cross section of a two fluid nozzle shown in FIG. 1.

FIG. 2 is a schematic cross section showing a configuration of the two fluid nozzle 13. The two fluid nozzle 13 has a configuration of, for example, a so-called external-mixing type two fluid nozzle.

The two fluid nozzle 13 includes a casing 32. A DIW discharge port 34 to discharge DIW toward an external space 33 and a nitrogen gas discharge port 35 formed in an annular shape surrounding the DIW discharge port 34 to discharge nitrogen gas toward the external space 33 are formed in the lower end of the casing 32.

To be more concrete, the casing 32 comprises an inner distribution pipe 36 and an outer holder 37 that surrounds the circumference of the inner distribution pipe 36 and holds the inner distribution pipe 36 coaxially in an interpolated state.

The inner distribution pipe 36 has a DIW channel 38 inside. The tip end (lower end) of the DIW channel 38 is opened as the DIW discharge port 34. A DIW introduction port 39 to introduce a fluid is formed on the upper end of the DIW channel 38 on the opposite side. The inner distribution pipe 36 is formed in the shape of a brim with the tip end portion (lower end portion) 40 and the upper end portion 41 on the opposite side overhanging outwards. The tip end portion 40 and the upper end portion 41 abut on the inner surface of the outer holder 37. A space 42 is defined between the outer surface of the inner distribution pipe 36 and the inner surface of the outer holder 37 from the tip end portion 40 to the upper end portion 41. A nitrogen gas channel 43 that communicates the space 42 and the external space 33 with each other is formed in the tip end portion 40 of the inner distribution channel 36. The tip end of the nitrogen gas channel 43 is opened as the nitrogen gas discharge port 35. The nitrogen gas channel 43 has an inclined sectional shape so that the tip end side comes closer to the central axis line of the inner distribution pipe 36.

The outer holder 37 has a nitrogen gas introduction port 44 on the side surface. The nitrogen gas introduction port 44 communicates with the space 42 defined between the outer surface of the inner distribution pipe 36 and the inner surface of the outer holder 37.

The DIW supply pipe 23 is connected to the DIW introduction port 39 and the nitrogen gas supply pipe 24 is connected to the nitrogen gas introduction port 44. When heated DIW is supplied to the DIW channel 38 through the DIW supply pipe 23 and also a heated nitrogen gas is supplied to the space 42 through the nitrogen gas supply pipe 24, heated DIW is discharged into the external space 33 from the DIW discharge port 34 and also the heated nitrogen gas is discharged into the external space 33 from the nitrogen gas discharge port 35. The heated DIW and the heated nitrogen gas then collide to be mixed within the external space 33, and a jet of fine droplets of DIW is formed.

It should be noted that the two fluid nozzle 13 is not limited to the one having the configuration of the external-mixing type two fluid nozzle, and it may have the configuration of a so-called internal-mixing type two fluid nozzle.

Figure 3:
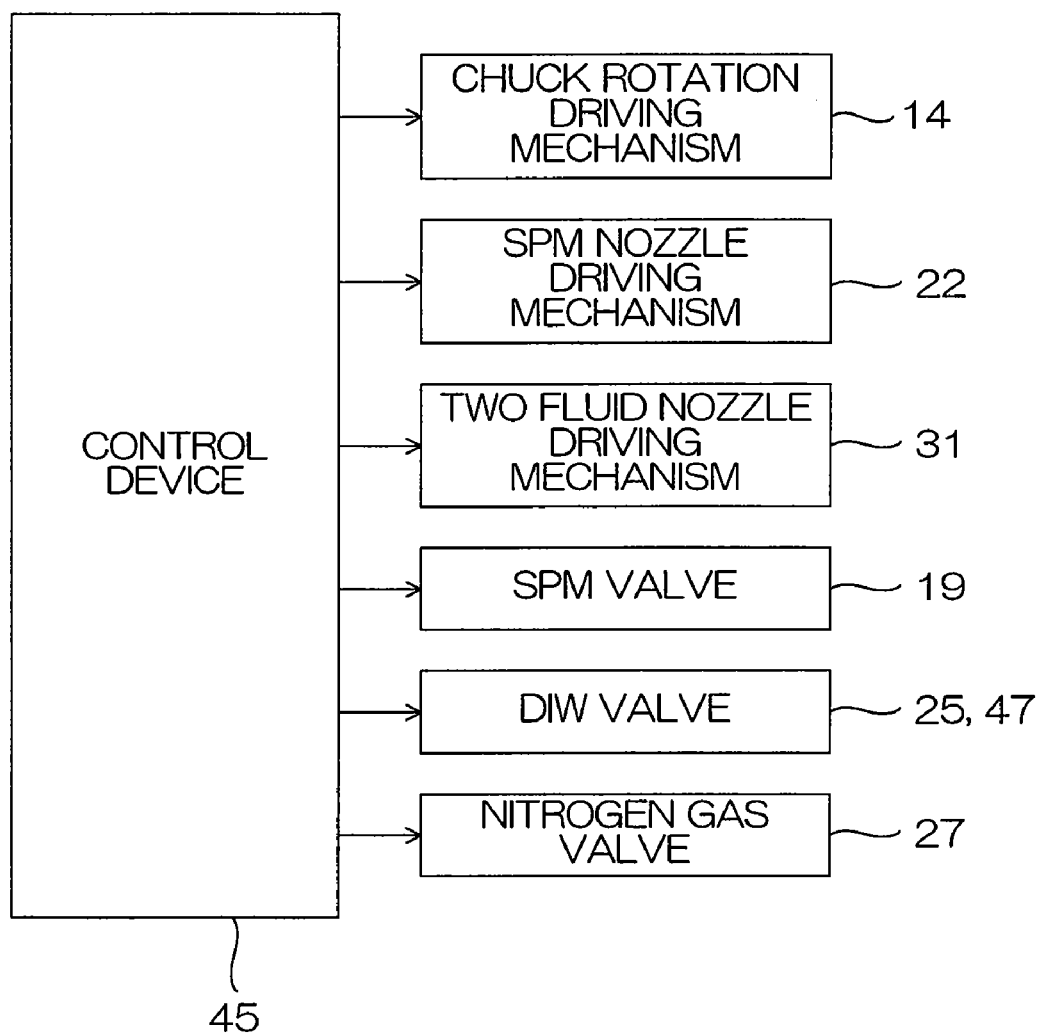
FIG. 3 is a block diagram showing an electric configuration of the substrate processing apparatus shown in FIG. 1.

FIG. 3 is a block diagram showing an electrical configuration of the substrate processing apparatus. The substrate processing apparatus further includes a control device 45 configured to have a micro computer.

The chuck rotation driving mechanism 14, the SPM nozzle driving mechanism 22, the two fluid nozzle driving mechanism 31, the SPM valve 19, the DIW valves 25 and 47, and the nitrogen gas valve 27 are connected to the control device 45 as subjects to be controlled. The control device 45 controls the operations of the chuck rotation driving mechanism 14, the SPM nozzle driving mechanism 22, and the two-fluid nozzle driving mechanism 31 according to a pre-determined program. Also, the control device 45 controls the SPM valve 19, the DIW water valves 25 and 47, and the nitrogen gas valve 27 to open and close.

Figure 4:
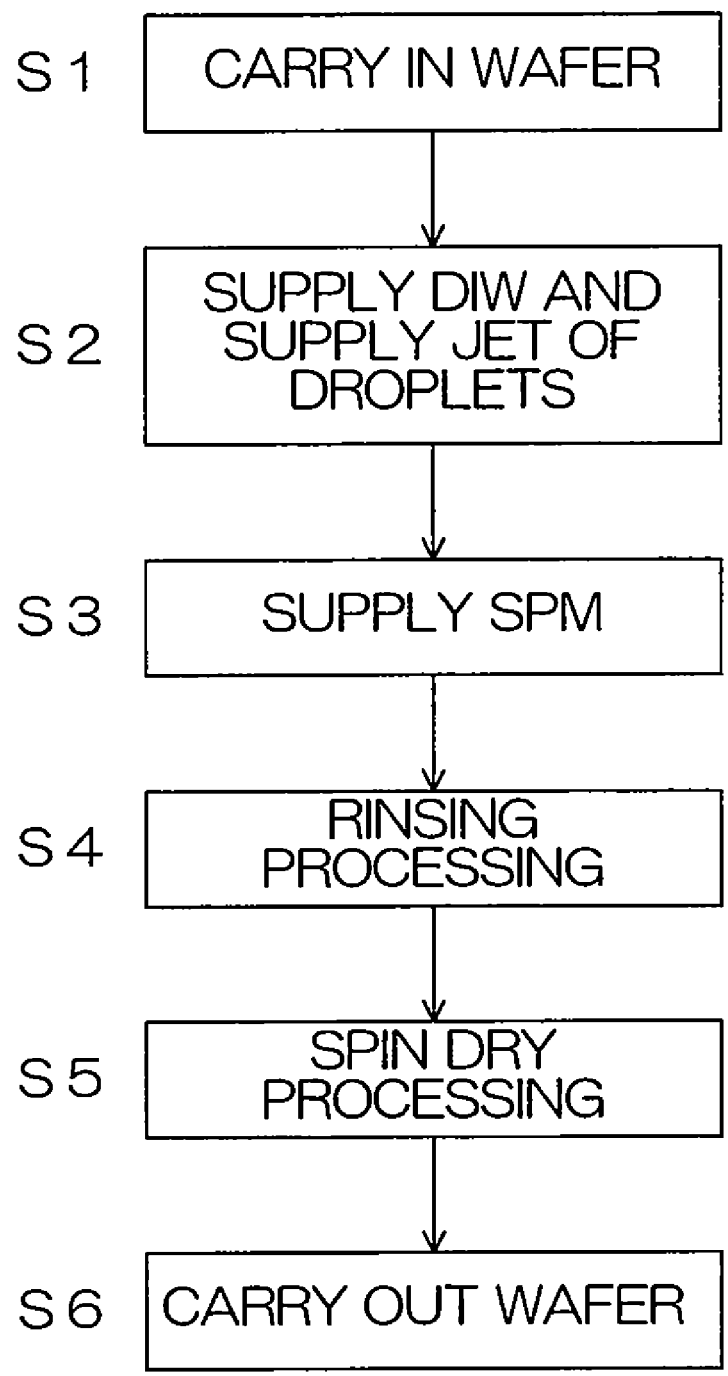
FIG. 4 is a view to describe processing in the substrate processing apparatus shown in FIG. 1.

FIG. 4 is a view to describe the processing on the wafer W. The wafer W after the ion implantation processing is carried in by an unillustrated transportation robot. The wafer W is then held by the spin chuck 11 in a state where the surface on which the resist is formed faces upward (Step S1). The wafer W has not undergone the processing to ash the resist. A hardened layer resulting from alteration caused by the ion implantation is therefore formed on the surface of the resist.

Since the chuck rotation driving mechanism 14 is controlled, the wafer W held by the spin chuck 11 is rotated at a predetermined rotation speed (for example, 100 rpm). The DIW valve 47 is then opened, and DIW in the state of a continuous flow is supplied to the surface of the rotating wafer W from the DIW nozzle 46. Also, since the two fluid nozzle driving mechanism 31 is controlled, the two fluid nozzle 13 is moved above the wafer W held by the spin chuck 11 from the stand-by position set on a side of the spin chuck 11. Thereafter, the DIW valve 25 and the nitrogen gas valve 27 are opened, and a jet of droplets generated by mixing heated DIW and a heated nitrogen gas is discharged from the two fluid nozzle 13. Meanwhile, since the two fluid nozzle driving mechanism 31 is controlled, the second arm 30 is oscillated within a predetermined angular range. Accordingly, the supply position on the surface of the wafer W to which a jet of droplets is introduced from the two fluid nozzle 13 moves while drawing an arc-shaped trajectory within a range from the center of rotation of the wafer W to the rim portion of the wafer W. As a result, the jet of droplets is supplied to the entire surface of the wafer W without any irregularity (Step S2). The hardened layer formed on the surface of the resist is broken by an impact when the jet of droplets collides on the surface of the wafer W. While the jet of droplets is supplied to the surface of the wafer W, a continuous flow of DIW is kept supplied to the wafer W from the DIW nozzle 46.

When reciprocal scanning of the jet supply position is performed a predetermined number of times, the DIW valves 25 and 47 and the nitrogen gas valve 27 are closed, and the supply of the jet of droplets from the two fluid nozzle 13 and the supply of a continuous flow of DIW from the DIW nozzle 46 are stopped. The two fluid nozzle 13 is then returned to the stand-by position on a side of the spin chuck 11 from above of the wafer W.

Therefore, since the SPM nozzle driving mechanism 22 is controlled, the SPM nozzle 12 is moved above the wafer W held by the spin chuck 11 from the stand-by position set on a side of the spin chuck 11. The SPM valve 19 is then opened, and hot SPM is supplied to the surface of the rotating wafer W from the SPM nozzle 12. Meanwhile, since the SPM nozzle driving mechanism 22 is controlled, the first arm 21 is oscillated within a predetermined angular range. Accordingly, the supply position on the surface of the wafer W to which SPM from the SPM nozzle 12 is introduced moves while drawing an arc-shaped trajectory within a range from the center of rotation of the wafer W to the rim portion of the wafer W. As a result, the SPM is supplied to the entire surface of the wafer W without any irregularity (Step S3).

Because the hardened layer on the surface of the resist has been broken by the jet of droplets, the hot SPM supplied to the surface of the wafer W can penetrate into the inside of the resist from the broken portions of the hardened layer. It is thus possible to remove the unnecessary resist formed on the surface of the wafer W in a satisfactory manner with an oxidation force of the SPM even when the wafer W to be processed has not undergone the ashing processing to remove the resist including the hardened layer by ashing.

When the reciprocal scanning of the SPM supply position is performed a predetermined number of times, the supply of the SPM to the wafer W is stopped. The SPM nozzle 12 is then returned to the stand-by position on a side of the spin chuck 11.

Thereafter, DIW is supplied to the surface of the wafer W from the DIW nozzle 46. The SPM adhering onto the surface of the wafer W is rinsed away with the DIW (Step S4). When a supply of the DIW is continued over a certain time, the supply of the DIW is stopped. Subsequently, processing (spin dry processing) is performed, by which the wafer W is dried by spinning off the DIW adhering onto the wafer W by a centrifugal force induced by rotations at a high rotation speed (for example, 3000 rpm) (Step S5). When this processing is completed, the rotations of the wafer W by the spin chuck 11 are stopped by controlling the chuck rotation driving mechanism 14. After the rotations of the wafer W are stopped, the processed wafer W is carried out by the unillustrated transportation robot (Step S6).

A jet of droplets generated by mixing the heated nitrogen gas and the heated DIW has a large energy. Hence, by supplying a jet of droplets to the surface of the wafer W, it is possible to break the hardened layer formed on the surface of the resist over the surface of the wafer W. By supplying the SPM to the surface of the wafer W after the hardened layer is broken, the SPM can penetrate into the inside of the resist from broken portions of the hardened layer. It is thus possible to remove the resist having the hardened layer formed on the surface of the wafer W in a satisfactory manner with the use of the SPM even when the wafer W has not undergone the ashing processing to remove the hardened layer. In addition, because the ashing is unnecessary, a problem of damages arising from the ashing can be avoided.

Since a continuous flow of DIW is supplied to the surface of the rotating wafer W while a jet of droplets is supplied to the surface of the wafer W, the surface of the wafer W is covered with the DIW, and the DIW flows over the surface of the wafer W toward the outer periphery of the wafer W by a centrifugal force induced by the rotations of the wafer W. Pieces of the hardened layer broken by the jet of droplets are thus removed from the surface of the wafer W together with the DIW flowing over the surface of the wafer W toward the outer periphery. It is thus possible to prevent the pieces of the broken hardened layer from adhering again onto the surface of the wafer W.

This embodiment describes a case where a heated nitrogen gas is supplied to the two fluid nozzle 13 by way of example. However, the nitrogen gas to be supplied to the two fluid nozzle 13 may not be heated. In a case where the nitrogen gas to be supplied to the two fluid nozzle 13 is heated, the energy of a jet of droplets can be increased further in comparison with a case where the nitrogen gas is not heated, which in turn makes it possible to break the hardened layer on the surface of the resist in a more satisfactory manner.

Also, instead of the nitrogen gas, helium gas, or argon gas, or a mixed gas of nitrogen and hydrogen, or carbon dioxide gas may be supplied to the two fluid nozzle 13.

Further, instead of the heated DIW, a chemical, such as heated SPM or sulfuric acid, may be supplied to the two fluid nozzle 13.

Figure 5:
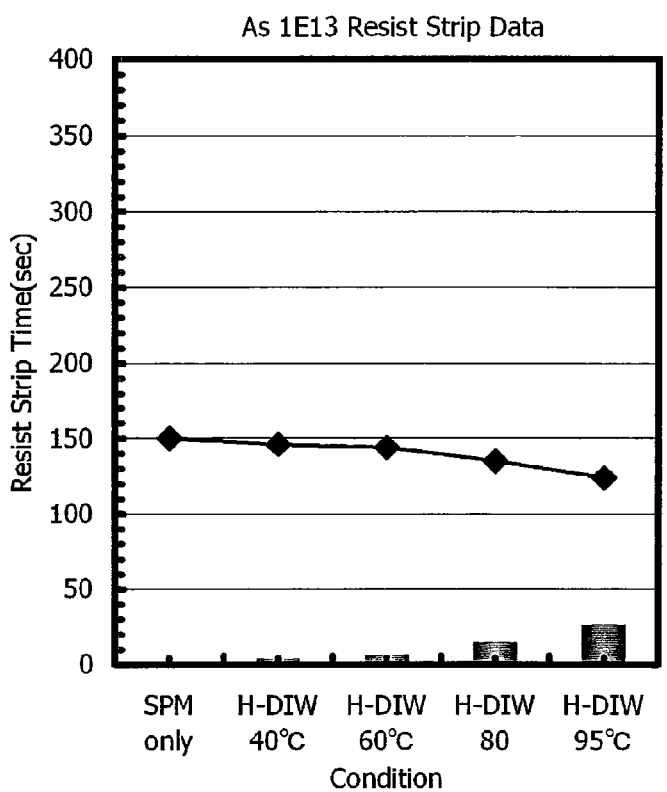
FIG. 5 is a graph showing the result of a resist strip test (No. 1)

FIG. 5 is a graph showing the result of a resist strip test (No. 1).

A resist pattern for a KrF (krypton fluoride) excimer laser was formed on a surface of a wafer W. Using the same as a mask, a sample with which As (arsenic) was ion-implanted at a dose of 1E13 atoms/cm$^2$ on the surface of the wafer W was prepared to conduct tests A1 to E1 to strip off (remove) the resist from the sample.

In Tests A1 to E1, there used SPM obtained by mixing sulfriric acid at 80° C. (concentration: 96% by weight) and DIW at 25° C. in the volume ratio of 2:1.

<Test A1>

SPM having a flow rate of 0.9/min was supplied from an SPM nozzle 12 to the surface of the wafer W (sample) to measure a time from when the supply of the SPM was started to when the resist was stripped off (resist strip time). The time thus measured was 150 seconds.

<Test B1>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 40° C. having a flow rate of 100 ml/min and nitrogen gas at 25° C. having a flow rate of 801/min. The time from when the supply of the jet of droplets was started to when the resist was stripped off was 146 seconds, which was shorter than the time measured in Test A1 by 4 seconds.

<Test C1>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 60° C. having a flow rate of 100 ml/min and nitrogen gas at 25° C. having a flow rate of 801/min. The time from when the supply of the jet of droplets was started to when the resist was stripped off was 144 seconds, which was shorter than the time measured in Test A1 by 6 seconds.

<Test D1>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 80° C. having a flow rate of 100 ml/min and nitrogen gas at 25° C. having a flow rate of 801/min. The time from when the supply of the jet of droplets was started to when the resist was stripped off was 135 seconds, which was shorter than the time measured in Test A1 by 15 seconds.

<Test E1>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 95° C. having a flow rate of 100 ml/min and nitrogen gas at 25° C. having a flow rate of 80 l/min. The time from when the supply of the jet of droplets was started to when the resist was stripped off was 124 seconds, which was shorter than the time measured in Test A1 by 26 seconds.

The time measured in each of the tests A1 to E1 is shown in FIG. 5 in a line graph. The difference (shortened time) between the time measured in each test B1 to E1 and the time measured in A1 is shown in a bar graph.

Figure 6:
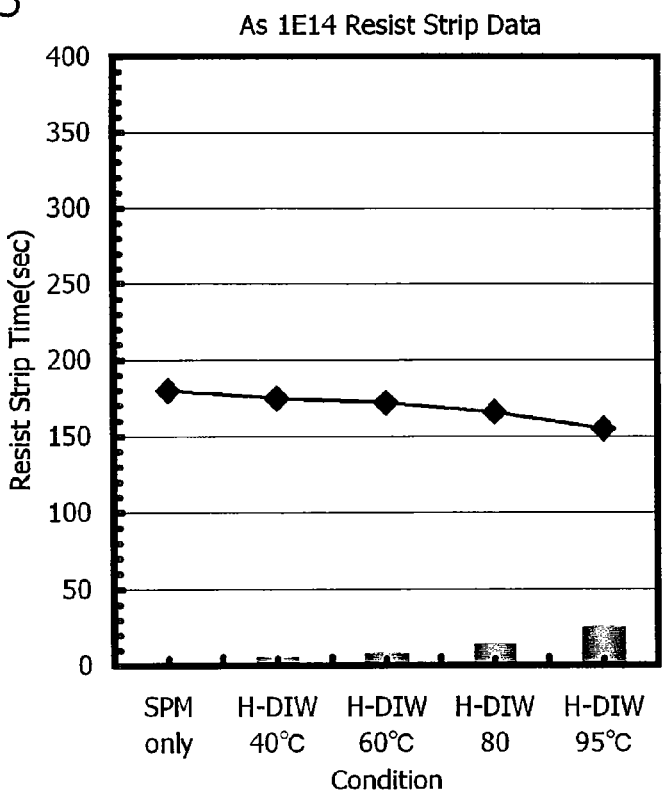
FIG. 6 is a graph showing the result of a resist strip test (No. 2)

FIG. 6 is a graph showing the result of a resist strip test (No. 2).

A resist pattern for an I line was formed on a surface of a wafer W. Using the same as a mask, a sample with which As (arsenic) was ion-implanted at a dose of 1E14 atoms/cm$^2$ on the surface of the wafer W was prepared to conduct tests A2 to E2 to strip off (remove) the resist from the sample.

In Tests A2 to E2, there used SPM obtained by mixing sulfuric acid at 80° C. (concentration: 96% by weight) and DIW at 25° C. in the volume ratio of 2:1.

<Test A2>

SPM having a flow rate of 0.9 l/min was supplied from the SPM nozzle 12 to the surface of the wafer W (sample) to measure a time from when the supply of the SPM was started to when the resist was stripped off (resist strip time). The time thus measured was 180 seconds.

<Test B2>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 40° C. having a flow rate of 100 ml/min and nitrogen gas at 25° C. having a flow rate of 80 l/min. The time from when the supply of the jet of droplets was started to when the resist was stripped off was 175 seconds, which was shorter than the time measured in Test A2 by 5 seconds.

<Test C2>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 60° C. having a flow rate of 100 ml/min and nitrogen gas at 25° C. having the flow rate of 80 l/min. The time from when the supply of the jet of droplets was started to when the resist was stripped off was 172 seconds, which was shorter than the time measured in Test A2 by 8 seconds.

<Test D2>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 80° C. having a flow rate of 100 ml/min and nitrogen gas at 25° C. having a flow rate of 80 l/min. The time from when the supply of the jet of droplets was started to when the resist was stripped off was 166 seconds, which was shorter than the time measured in Test A2 by 14 seconds.

<Test E2>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 95° C. having a flow rate of 100 ml/min and nitrogen gas at 25° C. having a flow rate of 80 l/min. The time from when the supply of the jet of droplets was started to when the resist was stripped off was 155 seconds, which was shorter than the time measured in Test A2 by 25 seconds.

The time measured in each of the tests A2 to E2 is shown in FIG. 6 in a line graph. The difference (shortened time) between the time measured in each test B2 to E2 and the time measured in A2 is shown in a bar graph.

Figure 7:
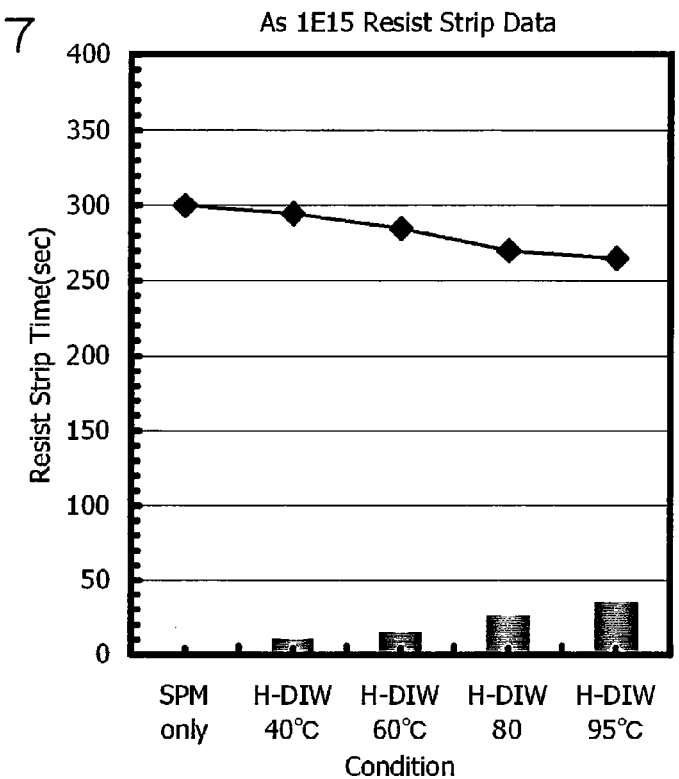
FIG. 7 is a graph showing the result of a resist strip test (No. 3)

FIG. 7 is a graph showing the result of a resist strip test (No. 3).

A resist pattern for an I line was formed on a surface of a wafer W. Using the same as a mask, a sample with which As (arsenic) was ion-implanted at a dose of 1E15 atoms/cm$^2$ on the surface of the wafer W was prepared to conduct tests A3 to E3 to strip off (remove) the resist from the sample.

In Tests A3 to E3, there used SPM obtained by mixing sulfuiric acid at 80° C. (concentration: 96% by weight) and DIW at 25° C. in the volume ratio of 2:1.

<Test A3>

SPM having a flow rate of 0.9 l/min was supplied from the SPM nozzle 12 to the surface of the wafer W (sample) to measure a time from when the supply of the SPM was started to when the resist was stripped off (resist strip time). The time thus measured was 300 seconds.

<Test B3>

A jet of droplets of DIW was supplied from a two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 40° C. having a flow rate of 100 ml/min and nitrogen gas at 25° C. having a flow rate of 80 l/min. The time from when the supply of the jet of droplets was started to when the resist was stripped off was 290 seconds, which was shorter than the time measured in Test A3 by 10 seconds.

<Test C2>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 60° C. having a flow rate of 100 ml/min and nitrogen gas at 25° C. having a flow rate of 80 l/min. The time from when the supply of the jet of droplets was started to when the resist was stripped off was 285 seconds, which was shorter than the time measured in Test A3 by 15 seconds.

<Test D3>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 80° C. having a flow rate of 100 ml/min and nitrogen gas at 25° C. having a flow rate of 80 l/min. The time from when the supply of the jet of droplets was started to when the resist was stripped off was 274 seconds, which was shorter than the time measured in Test A2 by 26 seconds.

<Test E3>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 95° C. having a flow rate of 100 ml/min and nitrogen gas at 25° C. having a flow rate of 80 l/min. The time from when the supply of the jet of droplets was started to when the resist was stripped off was 265 seconds, which was shorter than the time measured in Test A3 by 35 seconds.

The time measured in each of the tests A3 to E3 is shown in FIG. 7 in a line graph. The difference (shortened time) between the time measured in each test B3 to E3 and the time measured in A3 is shown in a bar graph.

Figure 8:
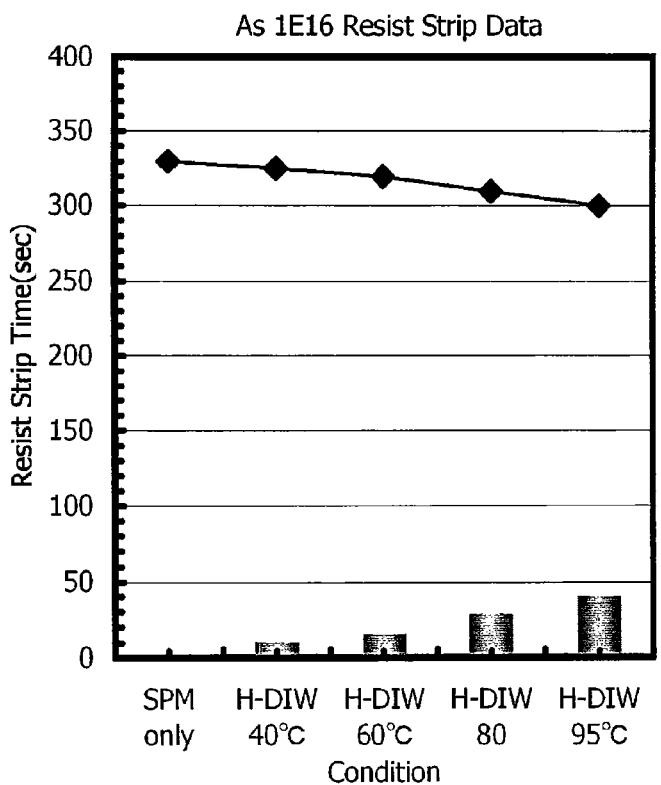
FIG. 8 is a graph showing the result of a resist strip test (No. 4).

FIG. 8 is a graph showing the result of a resist strip test (No. 4).

A resist pattern for a KrF excimer laser was formed on a surface of a wafer W. Using the same as a mask, a sample with which As (arsenic) was ion-implanted at a dose of 1E16 atoms/cm$^2$ on the surface of the wafer W was prepared to conduct tests A4 to E4 to strip off (remove) the resist from the sample.

In Tests A4 to E4, there used SPM obtained by mixing sulfuric acid at 80° C. (concentration: 96% by weight) and DIW at 25° C. in the volume ratio of 2:1.

<Test A4>

SPM having a flow rate of 0.9 l/min was supplied from the SPM nozzle 12 to the surface of the wafer W (sample) to measure a time from when the supply of the SPM was started to when the resist was stripped off (resist strip time). The time thus measured was 330 seconds.

<Test B4>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 40° C. having a flow rate of 100 ml/min and nitrogen gas at 25° C. having a flow rate of 80 l/min. The time from when the supply of the jet of droplets was started to when the resist was stripped off was 320 seconds, which was shorter than the time measured in Test A4 by 10 seconds.

<Test C4>

A jet of droplets of DIW was supplied from a two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 60° C. having a flow rate of 100 ml/min and nitrogen gas at 25° C. having a flow rate of 80 l/min. The time from when the supply of the jet of droplets was started to when the resist was stripped off was 315 seconds, which was shorter than the time measured in Test A4 by 15 seconds.

<Test D4>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 80° C. having a flow rate of 100 ml/min and nitrogen gas at 25° C. having a flow rate of 80 l/min. The time from when the supply of the jet of droplets was started to when the resist was stripped off was 302 seconds, which was shorter than the time measured in Test A4 by 28 seconds.

<Test E4>

A jet of droplets of DIW was supplied from the two fluid nozzles 13 to the surface of the substrate for 40 seconds. Thereafter, SPM was supplied from the SPM nozzle 12 to measure a time from when the supply of the jet of droplets was started to when the resist was stripped off (resist strip time). To the two fluid nozzles 13, there was supplied DIW at 95° C. having a flow rate of 100 ml/min and nitrogen gas at 25° C. having a flow rate of 80 l/min. The time from when the supply of the jet of droplets was started to when the resist was stripped off was 290 seconds, which was shorter than the time measured in Test A4 by 40 seconds.

The time measured in each of the tests A4 to E4 is shown in FIG. 8 in a line graph. The difference (shortened time) between the time measured in each test B4 to E4 and the time measured in A4 is shown in a bar graph.

From the results shown in FIGS. 5 to 8, it is understood that the more dose of As increases the time necessary to strip the resist. It is also understood that supplying a jet of droplets of DIW to the surface of the substrate before supplying SPM reduces the time necessary to strip the resist in comparison to a case of supplying only SPM to the surface of the wafer W. Furthermore, it is also understood that DIW at a higher temperature reduces the time necessary to strip the resist.

While one embodiment of the invention has been described, the invention can be implemented in embodiments other then the one described above. For example, in the embodiment described above, DIW is supplied to the surface of the wafer W from the DIW nozzle 46 while a jet of droplets is supplied to the surface of the wafer W from the two fluid nozzle 13. However, DIW may be kept supplied from the DIW nozzle 46 before a supply of a jet of droplets from the two fluid nozzle 13 is started. Also, a liquid supplied to the surface of the wafer W while a jet of droplets is supplied from the two fluid nozzle 13 is not limited to DIW, and it may be a chemical, such as SPM and sulfuric acid. It is, however, preferable to use a liquid of the same kind as a liquid used to generate a jet of droplets.

Further, the wafer W is used as an example of the substrate. However, a substrate to be processed is not limited to the wafer W, and it may be a glass substrate for a liquid crystal display, a glass substrate for a plasma display, a glass substrate for an FED, an optical disc substrate, a magnetic disc substrate, a magneto-optical disc substrate, or a photomask substrate.

While the embodiments of the invention have been described in detail, it should be appreciated that these embodiments represent examples to provide clear understanding of the technical contents of the invention, and the invention is not limited to these examples. The sprit and the scope of the invention, therefore, are limited solely by the scope of the appended claims.

This application is based upon and claims the benefits of priorities from the prior Japanese Patent Application No. 2005-299865 filed with the Japanese Patent Office on Oct. 14, 2005 and the prior Japanese Patent Application No. 2006-275098 filed with the Japanese Patent Office on Oct. 6, 2006, the entire contents of which are incorporated herein by reference.

What is claimed is:

1. A substrate processing method, comprising:
    a jet of droplets supplying step of supplying a jet of droplets generated from a gas and a heated processing liquid to a surface of a substrate;
    a resist stripping liquid supplying step of supplying a resist stripping liquid to the surface of the substrate after the jet of droplets supplying step;
    a substrate rotating step of rotating the substrate; and
    a liquid supplying step of supplying a liquid to the surface of the substrate in parallel with the substrate rotating step, wherein the liquid supplying step is performed in parallel with the jet of droplets supplying step.

2. The substrate processing method according to claim 1, wherein:
the resist stripping liquid includes a mixed liquid of sulfuric acid and a hydrogen peroxide liquid.

3. The substrate processing method according to claim 1, wherein:
the jet of droplets supplying step is a step of supplying a jet of droplets generated from a heated gas and the heated processing liquid.

4. A substrate processing method, comprising:
a jet of droplets supplying step of supplying a jet of droplets generated from a gas and a heated processing liquid to a surface of a substrate; and
a resist stripping liquid supplying step of supplying a resist stripping liquid to the surface of the substrate after the jet of droplets supplying step; wherein:
a hardened resist layer is formed on the surface of the substrate,
the jet of droplets supplying step includes a step of supplying the jet of droplets such that the hardened layer is broken, and
the resist stripping liquid supplying step includes a step of supplying the resist stripping liquid such that the resist stripping liquid penetrates into an inside of the hardened resist layer from a broken portion of the hardened resist layer.

5. The substrate processing method according to claim 4, wherein:
the resist stripping liquid includes a mixed liquid of sulfuric acid and a hydrogen peroxide liquid.

6. The substrate processing method according to claim 4, wherein:
the jet of droplets supplying step is a step of supplying a jet of droplets generated from a heated gas and the heated processing liquid.

7. The substrate processing method according to claim 4, further comprising:
a substrate rotating step of rotating the substrate; and
a liquid supplying step of supplying a liquid to the surface of the substrate in parallel with the substrate rotating step,
wherein the liquid supplying step is performed in parallel with the jet of droplets supplying step.

8. The substrate processing method according to claim 7, wherein:
the resist stripping liquid includes a mixed liquid of sulfuric acid and a hydrogen peroxide liquid.

9. The substrate processing method according to claim 7, wherein:
the jet of droplets supplying step is a step of supplying a jet of droplets generated from a heated gas and the heated processing liquid.

* * * * *